United States Patent [19]

Otsuka et al.

[11] Patent Number: 5,432,237
[45] Date of Patent: Jul. 11, 1995

[54] RADICALLY POLYMERIZABLE COMPOSITION

[75] Inventors: Reiko Otsuka; Yoshiaki Ikenoue; Yoshihiro Saida; Masao Kobayashi, all of Ohta, Japan

[73] Assignee: Showa Denko K.K., Tokyo, Japan

[21] Appl. No.: 185,156

[22] Filed: Jan. 24, 1994

Related U.S. Application Data

[63] Continuation of Ser. No. 527,468, May 23, 1990, abandoned.

[30] Foreign Application Priority Data

May 23, 1989 [JP] Japan .................. 1-129450

[51] Int. Cl.⁶ .................. C08F 279/00; C08F 291/14; H01B 1/12
[52] U.S. Cl. .................. 525/284; 525/282; 525/283; 525/279; 525/291; 525/296; 525/309; 252/500
[58] Field of Search .............. 525/282, 283, 284, 279, 525/291, 296, 309; 252/500

[56] References Cited

U.S. PATENT DOCUMENTS

| | | | |
|---|---|---|---|
| 4,640,748 | 2/1987 | Wudl et al. | 528/380 |
| 4,758,634 | 7/1988 | Jenekhe | 525/401 |
| 4,795,242 | 1/1989 | Wudl et al. | 528/405 |
| 4,933,106 | 6/1990 | Sakai et al. | 252/500 |
| 4,962,158 | 10/1990 | Kobayashi et al. | 525/279 |
| 4,963,206 | 10/1990 | Shacklette et al. | 428/426 |
| 5,066,731 | 11/1991 | Feldhues et al. | 525/417 |
| 5,137,993 | 8/1992 | Kobayashi et al. | 525/540 |
| 5,139,703 | 8/1992 | Jen | 252/500 |

FOREIGN PATENT DOCUMENTS

| | | |
|---|---|---|
| 62-133604 | 6/1987 | Japan . |
| 62-252089 | 11/1987 | Japan . |
| 63-118323 | 5/1988 | Japan . |
| 63-135453 | 6/1988 | Japan . |
| 63-215772 | 9/1988 | Japan . |
| 4184811 | 7/1992 | Japan . |

OTHER PUBLICATIONS

Derwent Abstract of Japan 63-215772 published Sep. 1988.

*Primary Examiner*—Vasu S. Jagannathan
*Attorney, Agent, or Firm*—Sughrue, Mion, Zinn, Macpeak & Seas

[57] ABSTRACT

Disclosed is a radical polymerizable composition comprised of a polymer having a $\pi$-electron conjugated structure having repeating units of a mono-substituted or di-substituted isothianaphthene structure, which is represented by the formula [Ia] and/or [Ib]:

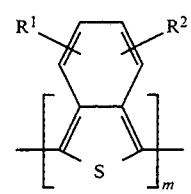

and/or

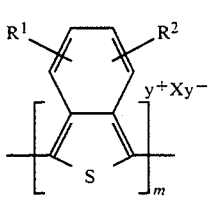

wherein $R^1$ and $R^2$ represent hydrogen, C1–C18 alkoxy group, or $-O(CH_2CH_2O)_nCH_3$ [n: 1 to 4] with the proviso that the case where both $R^1$ and $R^2$ represent hydrogen is excluded, X is an anion, y is from 0.01 to 1, and m is from 5 to 5,000, and a radical polymerizable compound. The radical polymerizable composition has a very stable electroconductivity in air and can be molded into an optional shape.

11 Claims, No Drawings

RADICALLY POLYMERIZABLE COMPOSITION

This is a Continuation of application Ser. No. 07/527,468, filed May 23, 1990, abandoned.

BACKGROUND OF THE INVENTION

1. Field of the Invention

The present invention relates to a radical polymerizable composition comprising, as one component, an electroconductive polymer having an isothianaphthene structure, which is very stable and is soluble in a general-purpose solvent. More particularly, it relates to a radical polymerizable composition comprising an electroconductive polymer having a π-electron conjugated structure having repeating units of a mono-substituted or di-substituted isothianaphthene structure and a radical polymerizable compound, which is suitable for use in the electric and electronic industries as a material for an electrode of a display element, a material for an electrochromic display element, a circuit material for a printed circuit board, an electrostatic charge accumulation-preventing material, and an electromagnetic shielding material.

2. Description of the Related Arts

Requirements for various electroconductive materials used in the electric and electronic fields are becoming more severe, and the development of electroconductive materials having superior performances such as a good processability, good long-period stability, and high transparency is eagerly desired.

To satisfy these requirements, research has been made into novel electroconductive polymeric compounds to be used in place of conventional carbonaceous and metallic electroconductive materials. Many proposals also have been made on the use of these electroconductive polymeric compounds. Electroconductive polymeric compounds so far proposed include heterocyclic polymers such as polythiophene and polypyrrole, and the use of these polymers as an material for an electrode of a secondary battery or an electrochromic material has been proposed.

Most of these heterocyclic polymers are insoluble and infusible, however, and the molding processability thereof is poor, and thus they cannot be put to practical use.

As the means for overcoming the above problem, some of the present inventors proposed a radical polymerizable composition comprising a compound having π-electron conjugated structure, such as polythiophene or polypyrrole, and a radical polymerizable compound (Japanese Patent Application No. 1-20202).

In this radical polymerizable composition, however, it is difficult to maintain an electroconductive state stably in air.

In connection with polyisothianaphthenes, only insoluble and infusible rigid electroconductive polymers are known, and there are only known a process in which a polymer is formed as a thin film on an electrode plate by electrochemical means (see, for example, Synthetic Metals, Vol. 14, page 45, 1986), and a process in which a polymer is formed as a powder by chemical means using an oxidizing agent (see, for example, Japanese Unexamined Patent Publication No. 63-118323). Known polyisothianaphthenes are characteristically advantageous over other electroconductive polymers in that they are stable in air, are easily doped with ordinary dopants to show a high electroconductivity, and a reversible color change between blue and transparency is shown by electrochemical operations such as doping and dedoping. Nevertheless, because of fatal insoluble and infusible properties, the use of these electroconductive polymers is limited.

SUMMARY OF THE INVENTION

An object of the present invention is to provide a radical polymerizable composition which can be shaped into an optional shape and has a very stable electroconductivity in air.

In accordance with the present invention, there is provided a radical polymerizable composition comprising a polymer having a π-electron conjugated structure having repeating units of at least one mono-substituted or di-substituted isothianaphthene structure selected from the group consisting of those which are represented by the following general formulae [Ia] and [Ib]:

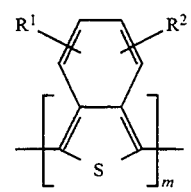 [Ia]

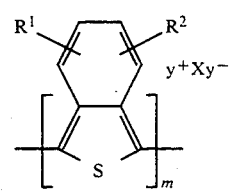 [Ib]

wherein $R^1$ and $R^2$ represent a hydrogen atom, an alkoxy group having 1 to 18 carbon atoms or $-O(CH_2CH_2O)_nCH_3$ (in which n is a number of from 1 to 4), with the proviso that the case where both $R^1$ and R represents a hydrogen atom is excluded, X represents an anion acting as a dopant, y is a number of from 0.01 to 1, which represents the molar ratio of the anion to the monomer, and m is a number of 5 to 5,000, which represents the degree of polymerization, and a radical polymerizable compound.

DESCRIPTION OF THE PREFERRED EMBODIMENTS

The polymer having a π-electron conjugated structure having repeating units of a mono-substituted or di-substituted isothianaphthene structure represented by the above-mentioned general formula [Ia] and/or [Ib] (hereinafter referred to as "polymer having a substituted isothianaphthene structure"), which is used in the present invention, can be prepared by various processes. For example, the polymer having a substituted isothianaphthene structure can be prepared by a process wherein a mono-substituted or di-substituted 1,3-dihydroisothianaphthene compound (hereinafter referred to as "substituted 1,3-dihydroisothianaphthene compound") represented by the following general formula [IIa]:

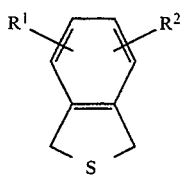

wherein R¹ and R² are as defined above, or a mono-substituted or di-substituted isothianaphthene compound (hereinafter referred to as "substituted isothianaphthene compound") represented by the following general formula [IIa]:

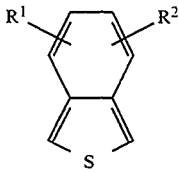

wherein R¹ and R² are as defined above, is oxidatively polymerized in a solvent by the action of an oxidizing agent, or a process wherein the abovementioned substituted isothianaphthene compound [IIb] is electrochemically polymerized in a solvent in the presence of a supporting electrolyte capable of giving a dopant.

As the oxidizing agent used for the oxidative polymerization of the substituted 1,3-dihydroisothianaphthene compound [IIa] or substituted isothianaphthene compound [IIb], there can be mentioned quinones such as 2,3-dichloro-5,6-dicyano-1,4-benzoquinone (hereinafter referred to as "DDQ"), tetrachloro-1,2-benzoquinone (i.e., o-chloranil) and tetrachloro-1,4-benzoquinone (i.e., chloranil), halogens such as iodine and bromine, and Lewis acids such as ferric chloride, molybdenum chloride and ruthenium chloride. In the case of a substituted isothianaphthene compound having a high reactivity, oxidative polymerization sometimes occurs due to the influence of dissolved oxygen. The amount of the oxidizing agent used is changed according to the kind of oxidizing agent used and is not simply defined, but preferably the oxidizing agent is generally used in an amount 1 to 10 times the amount of the monomer.

The polymerization temperature adopted for the oxidative polymerization of the substituted 1,3-dihydroisothianaphthene compound or substituted isothianaphthene compound is determined according to the polymerization process and cannot be simply defined. In general, however, the oxidative polymerization is preferably carried out at a temperature of $-80°$ to $120°$ C. The polymerization time is changed according to the polymerization process, the polymerization temperature, and the structure of the substituted 1,3-dihydroisothianaphthene compound or substituted isothianaphthene compound and cannot be simply defined, but preferably, the polymerization is usually conducted for 0.1 to 200 hours. The kind of polymerization solvent, as well as the polymerization temperature or polymerization time, is changed according to the kind of oxidizing agent used for the polymerization reaction, and the structure of the monomer and cannot be simply defined, but in general, such solvents as dichloromethane, dichloroethane, chloroform, tetrahydrofuran, dioxane, ethyl acetate, benzene, toluene, xylene, and anisole are used.

The kind of solvent used for the electrochemical polymerization of the substituted isothianaphthene compound [IIb] is not particularly critical, but preferably, where a substituted isothianaphthene compound represented by the general formula [IIb] is electrochemically polymerized in the presence of a supporting electrolyte, for example, acetonitrile, benzonitrile, propionitrile, dioxane, tetrahydrofuran, sulfolane, and propylene carbonate are used. As the supporting electrolyte used for the electrochemical composition, there can be mentioned tetraethylammonium bromide, tetraethylammonium chloride, tetra-n-butylammonium bromide, tetra-n-butylammonium chloride, tetraphenylphosphonium bromide, and tetraphenyl phosphonium chloride. The amount of the supporting electrolyte is such that the concentration in a single solvent as described above or a mixed solvent comprising two or more of the foregoing solvents is $10^{-4}$ to 5M, preferably $10^{-2}$ to 1M. The concentration of the substituted isothianaphthene compound is preferably $10^{-4}$ to 1M.

Of substituted 1,3-dihydroisothianaphthene compounds represented by general formula [IIa], a di-substituted 1,3-dihydroisothianaphthene compound of general formula [IIa] having substituents bonded to the 5- and 6-positions can be prepared by subjecting a 1,2-substituted dialkoxybenzene (for example, 1,2-dioxymethylene-benzene) represented by the following general formula [III]:

wherein R¹ and R² are as defined above, directly to bishalogenomethylation in, for example, a 37% aqueous formaldehyde solution/concentrated hydrochloric acid mixed solvent ( see, for example, West German Patent Publication No. 1,924,747) to form a 1,2-bischloromethylbenzene represented by the following general formula [IV]:

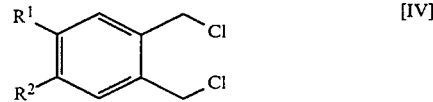

wherein R¹ and R² are as defined above, and subjecting the obtained compound to intramolecular ring-closing reaction with sodium sulfide nonanhydrate, similar to the reaction known from literature references (see, for example, J. Org. Chem., 36, 25. p. 3932). Separately, a mono-substituted 1,3-dihydroisothianaphthene compound represented by general formula [IIa] can be easily prepared by halogenating a 4-substituted o-xylene represented by the following general formula (V):

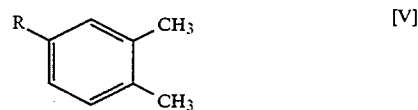

wherein R represents an alkoxy group having 1 to 18 carbon atoms or $-O(CH_2CH_2O)_nCH_3$ in which n is a number of from 1 to 4, according to a known process by using, for example, N-bromosuccinimide, N-chlorosuccinimide or bromine to form a 1,2-bishalogenomethylbenzene represented by the following general formula [VI]:

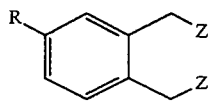

wherein R is as defined above and Z is bromine or chlorine and subjecting the obtained compound to the same intramolecular ring-closing reaction as described above.

As the substituted 1,3-dihydroisothianaphthene compound represented by general formula [IIa], there can be mentioned compounds in which $R^1$ and $R^2$ represent a hydrogen atom (the case where both $R^1$ and $R^2$ simultaneously represent a hydrogen atom is excluded), an alkoxy group having 1 to 18 carbon atoms or —O(CH$_2$CH$_2$O)$_n$CH$_3$ (in which n is a number of from 1 to 4), but compounds in which a long-chain substituent is bonded to one or both of the 5- and 6-positions of the isothianaphthene skeleton are preferably used. As typical examples, there can be mentioned monosubstituted compounds such as 5-decyloxy-substituted compound, 5-undecyloxy-substituted compound, 5-dodecyloxy-substituted compound, 5-tetradecyloxy-substituted compound, 5-pentadecyloxy-substituted compound, and 5-octadecyloxy-substituted compound; and di-substituted compounds such as 5,6-didecyloxy-substituted compound, 5,6-didodecyloxy-substituted compound, 5,6-dipentadecyloxy-substituted compound, 5,6-dioctadecyloxy-substituted compound, 5-decyloxy-6-octadecyloxy-substituted compound, 5-tridecyloxy-6-hexadecyloxy-substituted compound, 5-(2-methoxyethoxy)-substituted compound, 5-[2-(2-methoxyethoxy)ethoxy]-substituted compound, 5-[2-(2-(2-methoxyethoxy)ethoxy)ethoxy]-substituted compound, 5,6-bis[2-(2-methoxyethoxy)ethoxy]-substituted compound, and 5,6-bis[2-(2-(2-methoxyethoxy)ethoxy)ethoxy]-substituted compound.

As the substituted isothianaphthene compound represented by general formula [IIb], there can be mentioned compounds having corresponding substituents as described above with respect to the substituted 1,3-dihydroisothianaphthene compound. The substituted isothianaphthene compound represented by the abovementioned general formula [IIb] can be similarly prepared from the substituted 1,3-dihydroisothianaphthene compound represented by the abovementioned general formula [IIa] through a known analogous preparation process. For example, by utilizing an analogous preparation process concerning an unsubstituted isothianaphthene compound, reported by F. Wudl et al in J. Org. Chem., 49, 18, p. 3382 (1984), a mono-substituted or di-substituted isothianaphthene compound represented by general formula [IIb] can be prepared. More specifically, a mono-substituted or di-substituted 1,3-dihydroisothianaphthene compound ([IIb]) is oxidized with NaIO$_4$ reagent or m-chlorobenzenezoyl peroxide to form a mono- or di-substituted 1,3-dihydroisothianaphthene-2-oxide compound represented by the following general formula [VII]:

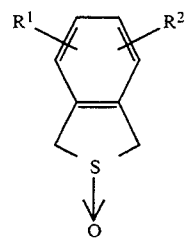

wherein $R^1$ and $R^2$ are as defined above, and the obtained compound is subjected to dehydration in the presence of active alumina, whereby an intended mono-substituted or di-substituted isothianaphthene compound having an isothianaphthene structure is obtained. Alternatively, an intended substituted isothianaphthene compound can be prepared according to a process comprising subjecting a mono-substituted or di-substituted 1,3-dihydroisothianaphthene-2-oxide compound (above-mentioned general formula [VII]) to Pummerer reaction in an acetic anhydride/sodium acetate reaction medium.

The polymer having a substituted isothianaphthene structure represented by general formula [Ia] has a side chain in which $R^1$ and $R^2$ represent a hydrogen atom (the case where $R^1$ and $R^2$ simultaneously represent a hydrogen atom is excluded), an alkoxy group having 1 to 18 carbon atoms or —O(CH$_2$CH$_2$O)$_n$CH$_3$ (in which n is a number of from 1 to 4). Preferably, however, a polymer having a side chain in which $R^1$ and $R^2$ represent a hydrogen atom (the case where $R^1$ and $R^2$ simultaneously represent a hydrogen atom is excluded), a long-chain alkoxy group having 4 to 18 carbon atoms or —O(CH$_2$CH$_2$O)$_n$CH$_3$ (in which n is a number of from 1 to 4) is used because this polymer has a high solubility in general-purpose solvents. Most preferably, a polymer having a substituted isothianaphthene structure having substituents at the 5-and 6-positions, in which $R^1$ and $R^2$ represent a hydrogen atom (the case where $R^1$ and $R^2$ simultaneously represent a hydrogen atom is excluded), —OC$_4$H$_9$ or —O$_{10}$H$_{21}$, is used. As the polymer having a substituted isothianaphthene structure represented by general formula [Ia], there can be mentioned, for example, poly(5-decyloxyisothianaphthene), poly(5-undecyloxyisothianaphthene), poly(5-dodecyloxyisothianaphthene), poly(5-tridecyloxyisothianaphthene), poly(5-tetradecyloxyisothianaphthene), poly(5-hexadecyloxyisothianaphthene), poly(5-octadecyloxyisothianaphthene), poly(5,6-dibutoxyisothianaphthene), poly(5,6-didecyloxyisothianaphthene), poly(5,6-diundecyloxyisothianaphthene), poly(5,6-ditridecyloxyisothianaphthene), poly(5,6-ditetradecyloxyisothianaphthene), poly(5,6-dipentadecyloxyisothianaphthene), poly(5,6-dihexadecyloxyisothianaphthene), poly(5,6-dioctadecyloxyisothianaphthene), poly(5-decyloxy-6-octadecyloxyisothianaphthene), poly(5-decyloxy-6-hexadecyloxyisothianaphthene), poly(5-dodecyloxy-6-octadecyloxyisothianaphthene), poly(5-[2-methoxyethoxy]-isothianaphthene), poly(5-[2-(2-methoxyethoxy)ethoxy]-isothianaphthene), poly(5-[2-(2-(2-methoxyethoxy)ethoxy)ethoxy]isothianaphthene, poly(5,6-bis[2-(2-methoxyethoxy)ethoxy]-isothianaphthene), and poly(5,6-bis[2-(2-(2-methoxyethoxy)ethoxy)ethoxy]-isothianaphthene. As the anion X of the polymer having a substituted isothianaphthene structure represented by general formula [Ib], there can be mentioned Cl$^-$, Br$^-$, I$^-$, ClO$_4^-$, BF$_4^-$, PF$_6^-$, SbF$_6^-$, AsF$_6^-$, AlCl$_4^-$, AlBr$_3$Cl$^-$, FeCl$_4^-$, SnCl$_3^-$, an anion of trifluoromethanesulfonic acid, and an anion of 1,2-dichloro-4,5-dicyanohydroquinone (DDH$_2$Q).

In the polymer having a substituted isothianaphthene structure, which is used in the present invention, the structure in the neutral state is represented by general formula [Ia] and the structure in the oxidative doped state is represented by general formula [Ib]. The polymer of the present invention prepared according to the chemical polymerization process or electrochemical polymerization process generally has the doped structure represented by general formula [Ib] just after the polymerization, but the polymer can be converted to a polymer of the neutral state represented by general formula [Ia] by the dedoping treatment (reducing reaction). Furthermore, this polymer can be reversibly converted to an oxidized polymer represented by general formula [Ib] by optionally controlling an oxidation current quantity (Coulomb quantity) by an oxidizing agent or electrochemical means.

The thus prepared polymer having a substituted isothianaphthene structure exhibits a very stable electroconductivity in air, and a film of this polymer has a high transparency in the highly electroconductive state and the polymer has a solubility in general-purpose solvents.

The polymerization degree m of the polymer having a substituted isothianaphthene structure is 5 to 5,000. If the polymerization degree m is lower than 5, the amount of the polymer incorporated for imparting an electroconductivity is increased, and if the polymerization degree m is higher than 5,000, problems arise in connection with the solubility and the operation adaptability.

Various compounds disclosed in "Lectures of Polymerization Reactions", Volume 1, Radical Polymerization (I), pages 5 through 9 are used as the radical polymerizable compound in the present invention. Preferably, there can be used styrene, nucleus-substituted styrene compounds such as divinylbenzene and p-chloromethylstyrene, acrylic ester compounds such as methyl acrylate, epoxy acrylate and trimethylolpropane triacrylate, methacrylic acid ester compounds such as methyl methacrylate and epoxy methacrylate, reaction products of allylidene compounds such as diallylpentaerythritol with other compounds such as polythiol compounds, allyl compounds such as allyl chloride, vinylamide compounds such as N-vinylpyrrolidone, acrylamide compounds such as acrylamide and methacrylamide, imides, lactams and carbazole compounds. Most preferably, styrene, epoxy acrylate, epoxy methacrylate, and mixtures thereof are used. The incorporation of this radical polymerizable compound provides a durability to a cured product obtained from the radical polymerizable composition.

The mixing ratio between the polymer having a substituted isothianaphthene structure and the radical polymerizable compound is not particularly critical, but to impart satisfactory characteristics, preferably the mixing ratio of the polymer having a substituted isothianaphthene structure is 0.1 to 40% by weight, especially 5 to 30% by weight, based on the composition. If the mixing ratio of the polymer having a substituted isothianaphthene structure is lower than 0.1% by weight, the electroconductivity of the obtained cured product is poor, and if the mixing ratio of the polymer having a substituted isothianaphthene structure is higher than 40% by weight, the shapability and the mechanical strength of the cured product are poor.

The process for preparing the radical polymerizable composition is not particularly critical, but preferably the polymer having a substituted isothianaphthene structure is dissolved or dispersed as uniformly as possible. For this purpose, a process is preferably adopted in which an appropriate organic solvent is added or the mixing is carried out under heating.

The kind of the solvent used according to need is not particularly critical, so long as it is capable of dissolving therein the polymer having a substituted isothianaphthene structure and the radical polymerizable compound. Preferably, aromatic solvents such as benzene, toluene and xylene, halogenated hydrocarbons such as chloroform, and ether compounds such as tetrahydrofuran are used.

The organic solvent is preferably used in an amount of 5 to 10 parts by weight per part by weight of the radical polymerizable compound.

Various additives can be added to the radical polymerizable composition of the present invention according to need. For example, radical polymerization initiators and radical polymerization initiating assistants can be used. As the radical polymerization initiator, preferably carbonyl compounds such as benzophenone and benzoin isopropyl ether, azo compounds such as azobisisobutyronitrile and azodibenzoyl, and peroxides such as hydrogen peroxide, benzoyl peroxide, ammonium persulfate and cumene hydroperoxide are used. As the radical polymerization initiating assistant, preferably N,N-dimethylaminoethanol and dimethylaniline are used.

The radical polymerizable composition of the present invention prepared according to the abovementioned process is coated on the surface of an insulator such as a plastic material, a ceramic material or wood by an ordinary coating method such as bar coating, spray coating or dip coating and is then polymerized to obtain an article having a cured coating film formed on the surface of the insulator. Furthermore, the radical polymerizable composition is cast in a mold having an optional shape and is polymerized in the mold, whereby an article having a shape corresponding to the shape of the mold is obtained.

The radical polymerizable composition has a very stable electroconductivity even if the operation of partially oxidizing or reducing the polymer having a substituted isothianaphthene structure, that is, the doping operation, is not carried out. To obtain a further increased electroconductivity, a process can be adopted in which an electroconductivity is imparted by doping before the polymerization, and then the polymerization is carried out, or a process in which the polymerization is carried out in advance and the obtained polymer is then doped. By this doping operation, the radical polymerizable composition of the present invention is converted to a state having a high electroconductivity and a high transparency.

The method of curing the radical polymerizable composition of the present invention is not particularly critical, and various energy rays such as heat rays, ultraviolet rays, electron beams, and X-rays can be used. The method using ultraviolet rays or electron beams is preferably adopted because the operation adaptability is good.

The present invention will now be described in detail with reference to the following examples.

In the examples, the molecular weight distribution was measured by GPC (gel permeation chromatography) described below. A high-speed liquid chromatograph (Model 665 supplied by Hitachi Ltd. was used as the pump, and Showdex GPC AC-802, AC-804 and AC-800P (supplied by Showa Denko K.K.) connected in series were used as the column. A differential refractometer (Showdex RI-SE-51 supplied by Showa Denko K.K.) and an ultraviolet-visible absorbancy detector (SPD-2A supplied by Shimadzu Corp.) were used as the detector. The molecular weight distribution of a sample polymer was examined at a temperature of 30° C. in chloroform as the solvent by using four kinds of polystyrenes as the reference substance. For the preliminary treatment for the measurement, the sample polymer was dissolved in chloroform and ammonia gas was blown into the solution to restore the polymer to the neutral state (the state represented by the above-mentioned general formula [Ia]), and the polymer was supplied to the GPC apparatus.

EXAMPLE 1

(a) Preparation of 5,6-didecyloxy-1,3-dihydroisothianaphthene ($R^1 = R^2 - C_{10}H_{21}O-$ in general formula [IIa])

A reaction vessel equipped with a gas-blowing tube was charged with 10 ml of 37% formalin and 20 ml of concentrated hydrochloric acid under cooling with ice water, and hydrogen chloride gas was blown with stirring for 30 minutes and 40 ml of an ether solution of 5.00 g (12.8 millimoles) of 1,2-didecyloxybenzene as the starting material was charged. The mixture was violently stirred at 0° to 5° C. for 1 hour, the temperature of the mixture was returned to room temperature, and the mixture was further stirred overnight. Then 50 ml of water was added to the mixture to separate an ether phase, the aqueous phase was extracted twice with fresh ether solvent, the obtained organic phase was repeatedly washed with water and dried with anhydrous sodium sulfate, and the solvent was removed by distillation to obtain a colorless solid containing 5.52 g (theoretical amount = 6.24 g) of 5,6-didecyloxy-1,2-bis-chloromethylbenzene [IV]. From the results of the $^1$H-NMR spectrum analysis, it was found that the solid was a mixture of the above compound and by-products. Without isolation and purification, this mixture was dissolved, together with 6.46 g of octyltrimethyl ammonium bromide as the phase transfer catalyst, into 500 ml of chloroform, and 6.15 g of sodium sulfide nonahydrate and 100 ml of an aqueous solution of 2.15 g of sodium hydrogencarbonate were added to the solution. The mixture was violently stirred at room temperature for 4 days, the chloroform solution was separated, washed twice with fresh water and dried with anhydrous sodium sulfate, and the solvent was removed by distillation to obtain 11.95 g of a light brown crude crystal. Isolation was carried out by the silica gel column chromatography using 40% chloroform/hexane as the developing solvent to obtain 0.862 g (yield = 15%) of 5,6-didecyloxy-1,3-dihydroisothianaphthene [IIa]. Recrystallization from chloroform/methanol gave 0.737 g of a colorless needle crystal.

(b) Preparation of poly(5,6-didecyloxyisothianaphthene) ($R^1 = R^2 = C_{10}H_{21}O-$ in general formula [Ia])

To 3 ml of a dry tetrahydrofuran (hereinafter referred to as "THF") solution of 150 mg (0.343 millimole) of 5,6-didecyloxy-1,3-dihydroisothianaphthene was added 2 ml of a THF solution of 156 mg (0.685 millimole) of DDQ at room temperature with stirring. After 1 hour, the reaction solution became a blackish-brown color, and when the reaction solution was heated and refluxed for 10 hours, the reaction mixture became a deep blue color. When the reaction solution was examined by the ultraviolet-visible-near infrared absorption spectrum analysis, a state resembling the oxidized state [IIb] of 5,6-didecyloxyisothianaphthene was observed. Accordingly, after the heating reaction, to remove excessive DDQ and the reduction product thereof, that is, 1,2-dichloro-4,5-hydroquinone (hereinafter referred to as "$DDH_2Q$"), the reaction solution was poured into 200 ml of a methanol solution containing 2% of sodium hydroxide to precipitate the polymer. The formed polymer was recovered by centrifugal separation and dissolved again in 4 ml of THF, and then the solution was poured again into the above-mentioned alkaline solution to again precipitate the polymer. This operation was further repeated 5 times. When the obtained deep blue polymer was analyzed by the ultraviolet-visible-near infrared absorption spectrum, it was found that the polymer did not show the oxidized state [Ib] but the neutral state [Ia]. To remove oligomers, the obtained polymer was again dissolved in 5 ml of THF, and the solution was poured into 30 ml of methanol to precipitate the polymer again. This dissolution-fractionation operation was further repeated 6 times to obtain 48 mg (after vacuum drying conducted overnight under 0.5 mmHg) of a deep blue polymer [Ia]. The polymerization degree of the polymer was about 1463.

(c) Preparation of radical polymerizable composition

To a liquid mixture of 45 mg of an epoxy acrylate resin (Ripoxy R-804 supplied by Showa Kobunshi) and 300 mg of tetrahydrofuran was added 5 mg of poly(5,6-didecyloxyisothianaphthene) prepared in (b) above, and they were mixed under heating to prepare a homogeneous solution having a dense blue color. Then, 0.2 mg of benzoin isopropyl ether as the polymerization initiator was incorporated and uniformly dispersed in the solution to obtain a radical polymerizable composition.

The obtained radical polymerizable composition was coated in a thickness of 2 μm on a glass sheet by using a bar coater, and ultraviolet ray curing was carried out in air by one high-pressure mercury lamp (output = 900 W/cm) to form a light blue cured film. When the electroconductivity of the cured film was measured, it was found that the electroconductivity was $5 \times 10^{-8}$ S/cm.

When the cured film was exposed to an iodine vapor to effect doping, the cured film became a light grey color, and the absorbancy was lower than 0.2 throughout the visible region. When the electroconductivity of the cured film was measured, it was found that the electroconductivity was 3 S/cm. This electroconductivity did not change even after the lapse of one week.

EXAMPLE 2

(a) Preparation of 5-decyloxy-1,3-dihydroisothianaphthene ($R^1 = C_{10}H_{21}O-$, $R^2 = H$ in general formula [IIa])

A suspension comprising 13.13 g (0.05 mole) of 1-decyloxy-3,4-dimethylbenzene, 18.26 g (0.1025 mole) of N-bromosuccinimide, 0.127 g (0.5 millimole) of benzoyl peroxide and 260 ml of dried carbon tetrachloride was heated and refluxed for 8 hours and 30 minutes, the precipitated white solid was removed by filtration, and the mother liquid was concentrated and allowed to stand at −20° C. in a freezer, whereby a colorless granular crystal was precipitated. The crystal was recovered by filtration, washed with hexane, and dried to obtain 3.07 g (yield=14.6%) of 1-decyloxy-3,4-bisbromomethylbenzene. Recrystallization from n-hexane gave 1.98 g of a colorless granular crystal having a melting point of 46.0° to 47.0° C. Then, in 100 ml of deaerated chloroform were dissolved 1.50 g (3.57 millimoles) of the 1-decyloxy-3,4-bisbromomethylbenzene prepared above and 2.42 g (7.14 millimoles) of tetra-n-butylammonium hydrogensulfate as the phase transfer catalyst, and 1.285 g (5.36 millimoles) of sodium sulfide nonahydrate and 70 ml of a deaerated aqueous solution of 0.60 g (7.14 millimoles) of sodium hydrogencarbonate were gradually added dropwise to the solution at room temperature over a period of 21 hours with violent stirring. The mixture then stirred at room temperature for 4 days, and the chloroform layer was separated and washed twice with fresh water. After the drying treatment with sodium hydrogensulfate, the solvent was removed by distillation to obtain 2.39 g of a brown viscous liquid. The liquid was separated by the silica gel column chromatography using 25% chloroform/hexane as the developing solvent to obtain 0.400 g (yield=38%) of 5-decyloxy-1,3-dihydroisothianaphthene. Recrystallization from n-hexane/methanol gave 0.220 g of a colorless needle crystal.

(b) Preparation of poly(5-decyloxyisothianaphthene) ($R^1=C_{10}H_{21}O-$, $R^2=H$ in general formula [Ia])

In 4 ml of dried THF was dissolved 198 mg (0.677 millimole) of 5-decyloxy-1,3-dihydroisothianaphthene obtained in (a) above, and 326 mg (1.422 millimoles) of DDQ was added to the solution. When the mixture was heated and refluxed for 9 hours, the dark green reaction solution (just after the addition) became a deep blue color. After the termination of the reaction, the operation of removing excessive DDQ and DDH and the solvent fractionation operation of removing oligomers were carried out in the same manner as described in Example 1 to obtain 13.4 mg (yield=6.8%, after vacuum drying conducted under 0.5 mmHg overnight) of a deep blue polymer (in the neutral state represented by the above-mentioned general formula [Ia]). The polymerization degree of the polymer was about 1280.

(c) Preparation of radical polymerizable composition

To a liquid mixture of 45 mg of an epoxy acrylate resin (Ripoxy R-804 supplied by Showa Kobunshi) and 300 mg of THF was added 5 mg of poly(5-decyloxyisothianaphthene) obtained in (b) above, and they were mixed under heating to obtain a homogeneous deep blue solution. The subsequent operations were carried out in the same manner as described in Example 1 to obtain a light blue cured film having an electroconductivity of $7\times10^{-8}$ S/cm.

When the cured film was exposed to an iodine vapor to effect doping, the cured film became a light grey color. The absorbancy was lower than 0.2 throughout the visible region. When the electroconductivity of the cured film was measured, it was found that the electroconductivity was 10 S/cm. The electroconductivity did not change even after the lapse of 1 week.

EXAMPLE 3

(a) Preparation of 5,6-dibutoxy-1,3-dihydroisothianaphthene ($R^1=R^2=C_4H_9O-$ in general formula [IIa])

A reaction vessel equipped with a gas blow-in tube was charged with 10 ml of 37% formalin and 20 ml of concentrated hydrochloric acid, and hydrogen chloride gas was blown into the reaction vessel with stirring. Then 40 ml of an ether solution of 5.00 g (22.5 millimoles) of 1,2-dibutoxybenzene as the starting material was added and the mixture was violently stirred at 0° to 5° C. for 1 hour. The temperature of the mixture was returned to room temperature and the mixture was further stirred overnight. Then 50 ml of water was added to the reaction mixture and the ether layer was separated, the aqueous phase was extracted twice with fresh ether solvent, the obtained organic phase was repeatedly washed with water and dried with anhydrous sodium sulfate, and the solvent was removed by distillation to obtain a colorless solid containing 6.63 g (theoretical amount=7.20 g) of 5,6-dibutoxy-1,2-bischloromethylbenzene [IV]. From the results of the $^1$H-NMR spectrum analysis, it was found that the solid was a mixture of the above compound and by-products. Without isolation and separation, the obtained solid was dissolved, together with 11.35 g of octyltrimethylammonium bromide as the phase transfer catalyst, in 500 ml of chloroform, and 8.00 g of sodium sulfide nonahydrate and 100 ml of an aqueous solution of 6.13 g of sodium hydrogencarbonate were added to the solution, and the mixture was violently stirred at room temperature for 4 days. The chloroform solution was then separated, washed twice with fresh water and dried with anhydrous sodium sulfate, and the solvent was removed by distillation to obtain 11.95 g of a reddish brown oil. Isolation was effected by conducting the silica gel column chromatography twice by using 40% chloroform/hexane as the developing solvent to obtain 0.23 g (yield=5%) of 5,6-dibutoxy-1,3-dihydroxyisothianaphthene [IIa] in the form of a light orange crystal. The results of the analysis of the obtained crystal were as shown below.

Melting point 77.0° to 77.5° C. $^1$H-NMMR (in CDCl$_3$, TMS standard, ppm, 60 MHz) 6.68 (2, 2H), 4.71 (s, 4H), 3.94 (t, 4H), 2.0–0.7 (m, 14H) IR (KBr, cm$^{-1}$) 810 w, 1097 s, 1220 s, 1288 s, 1520 m, 1603 w, 2880 m, 2950 m, 2960 m MS (EI) P$^+$=288 (100, standard), 224 (27), 168 (85), 151 (25), 139 (20) Elementary analysis values (%) (C$_{16}$H$_{24}$O$_2$S) Calculated values: C=68.53, H=8.63, S=11.43 Found values: C=67.95, H=8.31, S=11.80

(b) Preparation of poly(5,6-dibutoxyisothianaphthene) ($R^1=R^2=C_4H_9O-$ in general formula [Ia] or [Ib])

To 3 ml of a dry toluene solution of 150 mg (0.658 millimoles) of 5,6-dibutoxy-1,3-dihydroisothianaphthene obtained in (a) above was added 2 ml of a toluene solution of 299 mg (1.316 millimoles) of tetrachloro-1,4-benzoquinone (chloranil) at room temperature with stirring. After 1 hour, the reaction solution became a blackish brown color. When stirring was further conducted at 80° C. for 12 hours, a homogeneous reaction solution having a dark bluish brown color was obtained. The reaction solution was poured into 200 ml of methanol to precipitate the formed polymer. The obtained polymer had a dark blue color, and the amount of the obtained polymer was 103 mg (after vacuum drying conducted under 0.5 mmHg overnight).

The results of the analysis of the obtained polymer were as shown below.

Elementary analysis value (%) [C$_{16}$H$_{20}$O$_2$S)(C$_6$H$_2$O$_2$Cl$_4$)$_{0.06}$] Calculated values: C=67.49, H=6.92, S=11.00, Cl=2.93 Found values: C=67.86, H=7.41, S=10.85, Cl=3.04

From the number average molecular weight (Mn=36,000), the degree of polymerization m was estimated as 125. The ratio (Mw/Mn) of the weight average molecular weight (Mw) to the number average molecular weight (Mn) was 3.6.

(c) Preparation of radical polymerizable composition

To a liquid mixture of 45 mg of an epoxy acrylate resin (Ripoxy R-804 supplied by Showa Kobunshi) and 300 mg of toluene was added 5 mg of poly(5,6-dibutoxyisothianaphthene) having an average degree of polymerization m of about 125, which was obtained in (b) above, and they were mixed under heating to form a homogeneous solution having a dense greyish blue color. The subsequent operations were carried out in the same manner as described in Example 1 to obtain a blackish greyish blue cured film having an electroconductivity of $6 \times 10^{-4}$ S/cm.

When the cured film was exposed to an iodine vapor to effect doping, the cured film became a light grey color, and the absorbancy was lower than 0.2 throughout the visible region. When the electroconductivity of the cured film was measured, it was found that the electroconductivity was 8 S/cm. This electroconductivity did not change even after the lapse of 1 week.

REFERENTIAL EXAMPLE

To a liquid mixture of 45 g of an epoxy acrylate resin (Ripoxy R-804 supplied by Showa Kobunshi) and 300 g of THF was added 5 g of poly(3-dodecyl-2,5-thienylene) having an average polymerization degree of about 200, and they were mixed under heating to form a red homogeneous solution. Then, the subsequent operations were carried out in the same manner as described in Example 1 to obtain a red cured film having an electroconductivity of $5 \times 10^{-8}$ S/cm.

The cured film was exposed to an iodine vapor to effect doping, and the film became a brown color. When the electroconductivity was measured, it was found that the electroconductivity was 7 S/cm. This electroconductivity was reduced to 1/10 to 1/100 after the lapse of 1 day.

The radically polymerizable composition of the present invention has a superior moldability, transparency and mechanical strength, and shows a very stable electroconductivity in air. Therefore, the radical polymerizable composition of the present invention can be used as an electrode material of a display element, an electrochromic display element material, a circuit material of a printed circuit board, an electrostatic charge accumulation-preventing material, and an electromagnetic shielding material in the electric and electronic fields.

We claim:

1. A radical polymerizable composition comprising (1) 0.1 to 40% by weight of a soluble polymer having a $\pi$-electron conjugated structure having repeating units of at least one mono-substituted or di-substituted isothianaphthene structure selected from the group consisting of those which are represented by the following general formula (Ia) or (Ib):

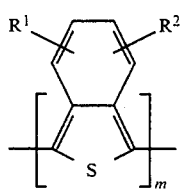

and/or

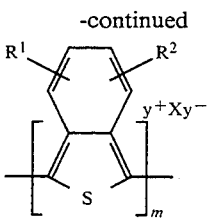

wherein $R^1$ and $R^2$ represent a hydrogen atom, an alkoxy group having 4 to 18 carbon atoms or —O(CH$_2$CH$_2$O)$_n$CH$_3$ in which n is a number of from 1 to 4, with the proviso that both $R^1$ and $R^2$ do not simultaneously represent a hydrogen atom, X represents an anion acting as a dopant, y is a number from 0.01 to 1, which represents the molar ratio of the anion to the monomer, and m is a number of 5 to 5,000, which represents the degree of polymerization, and wherein said soluble polymer having isothianaphthene structural units is soluble in an organic solvent and (2) 60 to 99.9% by weight of an ethylenically unsaturated radical polymerizable compound.

2. The radical polymerizable composition according to claim 1 wherein X in formula (Ib) represents an anion selected from the group consisting of Cl$^-$, Br$^-$, I$^-$, ClO$_4^-$, BF$_4^-$, PF$_6^-$, SbF$_6^-$, AsF$_6^-$, AlCl$_4^-$, AlBr$_3$Cl$^-$, FeCl$_4^-$, SnCl$_3^-$, an anion of trifluoromethanesulfonic acid, and an anion of 1,2-dichloro-4,5-dicyanohydroquinone.

3. The radical polymerizable composition according to claim 1 wherein the radical polymerizable compound is selected from the group consisting of styrene, nucleus-substituted styrene compounds, acrylic acid esters, methacrylic acid esters, reaction products of allylidene compounds with polythiol compounds, allyl compounds, vinylamide compounds, acrylamide compounds, imides, lactams, and carbazole compounds.

4. The radical polymerizable composition according to claim 1 wherein the radical polymerizable compound is selected from the group consisting of styrene, epoxy acrylate, and epoxy methacrylate.

5. The radical polymerizable composition according to claim 1 which comprises 5 to 30% by weight of the soluble polymer having a $\pi$-electron conjugated structure and 70 to 95% by weight of the radical polymerizable compound, based on the total weight of the polymer having the $\pi$-electron conjugated structure and the radical polymerizable compound.

6. The radical polymerizable composition according to claim 1 which further comprises an organic solvent selected from the group consisting of aromatic hydrocarbons, halogenated hydrocarbons, and ethers; the amount of the organic solvent being 5 to 10 times by weight of the radical polymerizable compound.

7. The radical polymerizable composition according to claim 1 which further comprises a radical polymerization initiator.

8. The radical polymerizable composition according to claim 1, wherein, in formulae (Ia) and (Ib), $R^1$ and $R^2$ represent a hydrogen atom, an alkoxy group having 4 to 18 carbon atoms or —O(CH$_2$CH$_2$O)$_n$CH$_3$, in which n is a number of from 1 to 4, with the proviso that both $R^1$ and $R^2$ do not simultaneously represent a hydrogen atom.

9. The radical polymerizable composition according to claim 1 wherein, in formulae (Ia) and (Ib), $R^1$ and $R^2$ represent a hydrogen atom, —OC$_4$H$_9$ or —OC$_{10}$H$_{21}$, with the proviso that both $R^1$ and $R^2$ do not simultaneously represent a hydrogen atom and $R^1$ and $R^2$ are bonded to the 5 and 6 positions of the isothianaphthene structure.

10. The radical polymerizable composition according to claim 1 wherein said soluble polymer having isothianaphthene structural units is soluble in an organic solvent selected from the group consisting of aromatic solvents, halogenated hydrocarbons and ethers.

11. A shaped article comprising a cured product of the radical polymerizable composition defined in any one of claims 2, 3, 4, 5, 6, 7, 1, 8 or 9.

* * * * *